United States Patent
Huber et al.

(10) Patent No.: US 10,965,053 B2
(45) Date of Patent: Mar. 30, 2021

(54) ELECTRICAL CONTACT ELEMENT

(71) Applicant: Rosenberger Hochfrequenztechnik GmbH & Co. KG, Fridolfing (DE)

(72) Inventors: Ludwig Huber, Fridolfing (DE); Stefan Reischl, Ainring (DE)

(73) Assignee: ROSENBERGER HOCHFREQUENZTECHNIK GMBH, Fridolfing (DE)

( * ) Notice: Subject to any disclaimer, the term of this patent is extended or adjusted under 35 U.S.C. 154(b) by 0 days.

(21) Appl. No.: 16/487,518

(22) PCT Filed: Feb. 8, 2018

(86) PCT No.: PCT/EP2018/053160
§ 371 (c)(1),
(2) Date: Oct. 23, 2019

(87) PCT Pub. No.: WO2018/162166
PCT Pub. Date: Sep. 13, 2018

(65) Prior Publication Data
US 2020/0194918 A1 Jun. 18, 2020

(30) Foreign Application Priority Data
Mar. 6, 2017 (DE) .................. 10 2017 002 150.3

(51) Int. Cl.
*H01R 13/02* (2006.01)
*H01R 13/24* (2006.01)
*H01R 13/03* (2006.01)
*H01R 43/16* (2006.01)

(52) U.S. Cl.
CPC ......... *H01R 13/2492* (2013.01); *H01R 13/03* (2013.01); *H01R 43/16* (2013.01)

(58) Field of Classification Search
CPC .... H01R 13/2492; H01R 13/03; H01R 43/16; G01R 1/06738
USPC ........................................................ 439/78
See application file for complete search history.

(56) References Cited

U.S. PATENT DOCUMENTS

| 3,525,066 | A |   | 8/1970 | Magee et al. |           |
|-----------|---|---|--------|--------------|-----------|
| 5,438,175 | A | * | 8/1995 | Herklotz     | H01H 1/023 |
|           |   |   |        |              | 200/269   |
| 5,806,181 | A | * | 9/1998 | Khandros     | H01R 43/16 |
|           |   |   |        |              | 29/840    |

(Continued)

FOREIGN PATENT DOCUMENTS

| CN | 106207500 A   | 12/2016 |
|----|---------------|---------|
| EP | 0941020 A2    | 9/1999  |
| WO | 2016146451 A1 | 9/2016  |

*Primary Examiner* — Abdullah A Riyami
*Assistant Examiner* — Nelson R. Burgos-Guntin
(74) *Attorney, Agent, or Firm* — David P. Dickerson

(57) ABSTRACT

The present invention relates to an electrical contact element (1), that has a plurality of contact areas ($2_1$, $2_2$), with a base body (6) made from a first material and a coating (7) applied to the base body (6) made from a coating material. In at least one area of the base body (6) within at least one contact area ($2_1$, $2_2$) in each case the first material is removed and is at least partially replaced by a second material. The second material and the coating material each have a higher electrical conductivity than the first material.

20 Claims, 8 Drawing Sheets

(56) References Cited

U.S. PATENT DOCUMENTS

| | | | | |
|---|---|---|---|---|
| 6,188,028 B1* | 2/2001 | Haba | H05K 3/325 | |
| | | | 174/255 | |
| 6,239,386 B1* | 5/2001 | DiStefano | H01R 13/2414 | |
| | | | 174/262 | |
| 6,665,930 B2 | 12/2003 | Matuschik | | |
| 6,672,875 B1* | 1/2004 | Mathieu | G01R 1/06727 | |
| | | | 257/E23.078 | |
| 7,435,108 B1* | 10/2008 | Eldridge | H01L 24/11 | |
| | | | 439/81 | |
| 7,458,816 B1* | 12/2008 | Mathieu | G01R 1/07342 | |
| | | | 439/66 | |
| 7,674,112 B2* | 3/2010 | Gritters | H01R 31/02 | |
| | | | 439/66 | |
| 2001/0012704 A1* | 8/2001 | Eldridge | H01R 12/57 | |
| | | | 439/66 | |
| 2001/0012739 A1* | 8/2001 | Grube | H01L 24/06 | |
| | | | 439/862 | |
| 2001/0044225 A1* | 11/2001 | Eldridge | H01R 13/2407 | |
| | | | 439/66 | |
| 2003/0013340 A1* | 1/2003 | Martin | G01R 1/06738 | |
| | | | 439/488 | |
| 2003/0015347 A1* | 1/2003 | Eldridge | H01R 12/00 | |
| | | | 174/260 | |
| 2004/0163252 A1* | 8/2004 | Khandros | H01L 24/16 | |
| | | | 29/884 | |
| 2005/0148214 A1* | 7/2005 | Mathieu | H01L 21/6835 | |
| | | | 439/67 | |
| 2005/0179458 A1* | 8/2005 | Chen | G01R 1/06738 | |
| | | | 324/755.07 | |
| 2006/0009055 A1* | 1/2006 | Li | H01R 13/2435 | |
| | | | 439/108 | |
| 2007/0020960 A1* | 1/2007 | Williams | H01R 12/52 | |
| | | | 439/66 | |
| 2007/0054515 A1* | 3/2007 | Williams | H01R 13/245 | |
| | | | 439/74 | |
| 2007/0068700 A1* | 3/2007 | Ohtsuki | B23K 26/0661 | |
| | | | 174/261 | |
| 2008/0171452 A1* | 7/2008 | Yakabe | G01R 3/00 | |
| | | | 439/66 | |
| 2010/0144216 A1* | 6/2010 | Daniel | H01L 24/90 | |
| | | | 439/862 | |
| 2011/0045695 A1* | 2/2011 | Miwa | H01R 12/714 | |
| | | | 439/586 | |
| 2011/0171859 A1* | 7/2011 | Fjelstad | H01R 13/15 | |
| | | | 439/862 | |
| 2012/0242363 A1* | 9/2012 | Breinlinger | G01R 1/06716 | |
| | | | 324/756.02 | |
| 2013/0002285 A1* | 1/2013 | Nelson | G01R 1/067 | |
| | | | 324/755.09 | |
| 2014/0091823 A1* | 4/2014 | Jiko | C23C 14/0605 | |
| | | | 324/755.01 | |
| 2014/0162506 A1* | 6/2014 | De Cloet | H01B 1/02 | |
| | | | 439/886 | |
| 2015/0136456 A1* | 5/2015 | Bednarek | C22C 18/00 | |
| | | | 174/256 | |
| 2015/0284866 A1* | 10/2015 | Meyerovich | C25D 3/62 | |
| | | | 205/50 | |
| 2015/0362551 A1* | 12/2015 | Saunders | G01R 31/2889 | |
| | | | 438/15 | |
| 2016/0064847 A1* | 3/2016 | Gaertner | C23C 2/06 | |
| | | | 439/741 | |
| 2016/0109481 A1* | 4/2016 | Chen | G01R 1/06727 | |
| | | | 324/755.04 | |
| 2016/0190741 A1* | 6/2016 | Bulmer | H01R 12/771 | |
| | | | 439/329 | |
| 2016/0352033 A1 | 12/2016 | Sachs et al. | | |
| 2018/0053714 A1* | 2/2018 | Foyet | C25D 3/50 | |
| 2020/0067210 A1* | 2/2020 | Tomaszek | H01R 13/03 | |
| 2020/0194918 A1* | 6/2020 | Huber | H01R 13/03 | |

\* cited by examiner

ELECTRICAL CONTACT ELEMENT

FIELD OF THE INVENTION

The invention relates to an electrical contact element.

TECHNICAL BACKGROUND

Electrical contact elements are used for the electrical connection of in each case two contact surfaces, which are applied to two different electrical or electronic components, for example, to a printed circuit board, an integrated circuit or a plug.

An electrical contact element is usually composed of a base body made from a comparatively hard base material, for example, from metal or ceramic, and a coating applied to the base body made from a coating material deviating from the base material. The base material has a certain hardness with regard to the mechanical stability of the contact element. Since the coating of the electrical contact element assumes the function of the electrical contacting, a comparatively soft material can be used as the coating material. The coating material should have a good electrical conductivity and in addition a high corrosion resistance. Gold is typically used as a coating material. In addition, however, for example, silver, ruthenium and rhodium are also used as coating material.

A contact element with a gold coating is known, for example, from U.S. Pat. No. 3,525,066 A.

If electrical contact elements are used, for example, in test sockets, in which integrated circuits to be tested are used, then a slight plane-parallel movement of the contact area of the electrical contact element occurs on the contact surface of the integrated circuit to be contacted each time an integrated circuit to be tested is inserted into the socket. This plane-parallel movement of the contact area of the contact element at the associated contact surface of the integrated circuit leads in the course of time to an undesired removal of the coating material in the contact area of the contact element. This removal of the coating material in the contact area of the contact element disadvantageously increases the electrical contact resistance of the electrical contact element in the contact area and thus the electrical contacting between the electrical contact element and the associated contact surface of the integrated circuit to be tested.

In the case of an electrical contact element according to the prior art the coating material is reduced after the removal process on the created contact surface only on the thin edge surface areas, which belong to the coatings of the contact element lateral to the contact surface. Since said edge surface areas with coating material are comparatively very small, the electrical contact resistance of the electrical contact element deteriorates significantly in the scraped-off contact area.

This is a state, which must be improved.

SUMMARY OF THE INVENTION

Against this background, the problem addressed by the present invention is to provide an electrical contact element, which has consistently good physical properties over an as long as possible service life.

Among other embodiments, the present disclosure teaches an electrical contact element, that has a plurality of contact areas each with a contact surface, with a base body made from a first material and a coating applied to the base body made from a coating material, wherein in at least one area of the base body within at least one contact area in each case the first material is removed and is at least partially replaced by a second material. The second material and the coating material each have a higher electrical conductivity compared to the first material.

A contact area of the electrical contact element is understood in this connection and hereafter to mean that area of the electrical contact element, which is in an electrical contact with an electrically conductive area, in particular with an electrically conductive contact surface, of an electrical or electronic component to be contacted, an electrical or electronic assembly to be contacted or an electrical or electronic functional unit of an electronic system to be contacted. In this connection, not only the direct contacting surface of the contact element, but rather also the area of the contact element directly adjacent to the direct contacting surface fall under contact area.

If a removal of the coating occurs in a contact area, in particular on the contact surface within the contact area, of the electrical contact element, due to the removal process after a certain number of plug cycles, then a new contact surface is formed in the contact area of the electrical contact element. This new contact surface has at least one surface area, in which the first material is replaced by the second material. The at least partial replacement of the first material by the second material in the contact area of the electrical contact element thus increases the contact surface area compared to a contact element according to the prior art, which contact surface area is produced from a material with a higher electrical conductivity compared to the first material. Advantageously, in the case of the removal of the coating an improvement of the electrical contact resistance in the contact area of the electrical contact element is achieved compared to an electrical contact element according to the prior art.

It is understood that the features mentioned above and those yet to be explained below can be used not only in the combination indicated in each case, but rather also in other combinations or considered alone, without leaving the scope of the present invention.

In a first manifestation in accordance with the present disclosure, the second material corresponds to the coating material. In this case the contact surface newly created by abrasion includes not only the thin edge surface areas of the coating with coating material, but rather also surface areas with the base body with coating material. These surface areas of the contact surface newly created by removal thus have a lower electrical contact resistance than the remaining surface areas of the contact surface newly created by removal, which include first material, that is, the base material of the base body.

In a second manifestation in accordance with the present disclosure, the second material corresponds to a material different from the coating material. Since this material different from the coating material also has a higher electrical conductivity than the first material, the contact surface newly created by abrasion includes surface areas with a lower electrical contact resistance. These surface areas are composed of the thin edge surface areas of the coating with coating material and the surface areas within the base body with a second material different from the coating material. The surface areas within the base body having the first material constitute the surface areas with a higher electrical contact resistance.

The second manifestation makes it possible, compared to the first manifestation to use a second material with a higher electrical conductivity compared to the coating material. In this way the electrical contact resistance can be adapted in the case of a contact surface newly created by removal to the electrical contact resistance of an associated, non-abraded contact surface or at least can be realized with the smallest possible losses. Both the first manifestation as well as the second manifestation preferably permit the realization of a contact surface newly created by removal, which includes surface areas made from the second material and from coating material, which in total are increased in comparison to the summed surface areas of the coating within the contact surface newly created by abrasion. Thus, compared to an electrical contact element according to the prior art a contact surface of a contact element in accordance with the present disclosure newly created by removal results, which advantageously has in total larger surface areas with a lower electrical contact resistance.

In a first embodiment of the contact element the at least one area of the base body within the individual contact area, in which the first material is at least partially replaced by a second material with higher electrical conductivity compared with the first material, is in each case realized as a blind-hole bore or as a through-bore.

A through-bore is understood to mean in this connection and hereafter a bore, which extends within the contact area of the contact element from one outer surface to an opposite outer surface of the contact element.

A blind-hole bore is understood to mean in this connection and hereafter a bore, which extends within the contact area of the contact element from an outer surface of the contact element up to an area in the interior of the contact element, that is, in the base body of the contact element, and ends there.

In both cases—through-bore and blind-hole bore—in each case this can be a bore with a circular cross-section profile, a so-called round-hole bore, or a bore with an elongated cross-section profile, a so-called elongated-hole bore. Additionally, however, bores with another cross-section profile are covered, for example, with a square or a rectangular cross-section profile.

In a first sub-variant of the first embodiment the bore is completely filled with the second material. In a second sub-variant of the first embodiment the bore is only partially filled with the second material, in particular, the inner wall of the bore is coated with the second material. The contact surface of the electrical contact element newly created by removal has a comparatively larger surface portion with the second material compared to the second sub-variant and thus possesses a lower electrical contact resistance.

The bores within the respective contact area of the electrical contact element provided at least partially with the second material, as is shown even further below, can have specific orientations within the contact element and relative to the original contact surface in the respective contact area of the contact element.

In a second embodiment the at least one area in the base body within the respective contact area of the electrical contact element, in which the first material is at least partially replaced by a second material with a higher electrical conductivity compared to the first material, is in each case a slot, which extends through the coating into the base body.

A slot is understood to mean in this connection and hereafter a recess starting from the original contact surface in the respective contact area of the electrical contact element with a specific slot depth and a specific slot width, which extends from an outer surface adjacent to the original contact surface to the respectively opposite outer surface of the contact element.

In this connection the individual slot is completely filled with the second material in a first sub-variant of the second embodiment. In a second sub-variant of the second embodiment the individual slot is only partially filled with the second material. In particular, in the second sub-variant only the inner walls of the individual slot are coated with a second material.

In a third embodiment the at least one area in the base body within the respective contact area of the electrical contact element, in which the first material is replaced by a second material with a higher electrical conductivity compared to the first material, in each case is realized as a cavity located within the base body in the respective contact area of the electrical contact element. This cavity is filled with a second material and preferably is completely surrounded by the first material of the base body. The cavity can be a spherical, cuboidal, ellipsoidal, cubic or other regularly formed cavity. Alternatively, the cavity located solely within the base body in the respective contact area of the electrical contact element, which is filled with the second material, can also have any other possible irregular shape. If a plurality of such cavities filled in each case with a second material are present within the base body in the respective contact area of the contact element, then these cavities filled in each case with a second material can be arranged relative to each other either stochastically disordered or also in a specific order structure, for example, in a grid.

In a fourth embodiment the at least one area in the base body within the respective contact area of the electrical contact element, in which the first material is replaced by a second material with a higher electrical conductivity than the first material, is in each case a layer with a specific layer thickness, which extends according to its orientation in the contact element at least over the entire respective contact area. In a preferred extension of the fourth embodiment the individual layer according to its orientation in the contact element extends over the entire extent of the electrical contact element. The individual layer is in this connection preferably completely produced from the second material. If a plurality of layers made from the second material are present, then these layers are oriented parallel to one another. A preferred orientation of such a layer takes place in the plane of the two main extension directions of the electrical contact element. Alternatively, such layers made from the second material can also be oriented perpendicular to the plane of the two main extension directions of the electrical contact element.

The above embodiments and further developments, if appropriate, can be combined with one another as desired. Further possible embodiments, further developments and implementations of the invention also comprise not explicitly mentioned combinations of features of the invention described previously or hereafter with regard to the embodiments. In particular, a person skilled in the art will thereby add individual aspects as improvements or additions to the respective basic form of the present invention.

SUMMARY OF THE DRAWING

The present invention is elucidated in detail below by means of the embodiments indicated in the schematic figures of the drawing.

Figure 1:
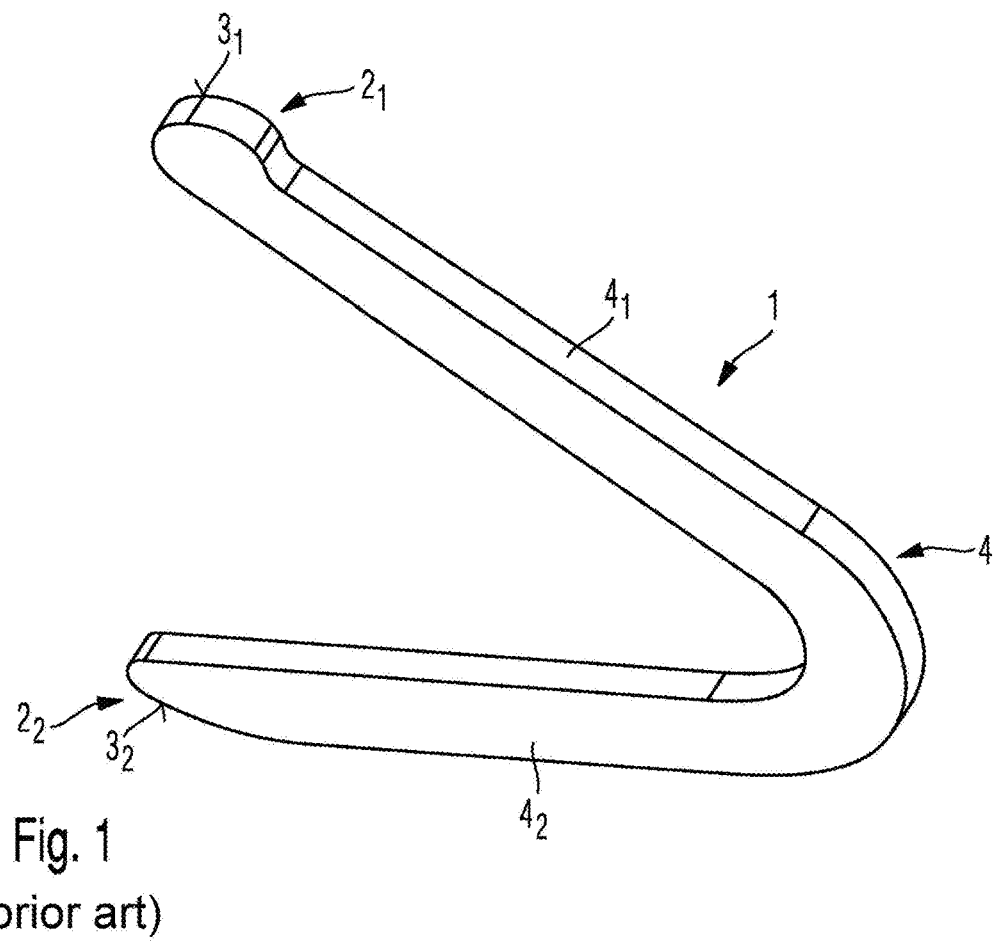
FIG. 1 shows a representation of an electrical contact element according to the prior art.

The attached figures of the drawing should convey a further understanding of the embodiments of the invention. They illustrate the individual manifestations, sub-variants and embodiments and serve in connection with the description to explain principles and concepts of the invention. Other embodiments and many of the advantages mentioned emerge with regard to the drawings. The elements of the drawings are not necessarily shown to scale relative to each other.

In the figures of the drawing elements, features and components which are the same, functionally identical and act the same—unless otherwise stated—are provided in each case with the same reference signs.

The figures are described below coherently and comprehensively.

DESCRIPTION OF THE EMBODIMENTS

First, the principle design of an exemplary contact element will be elucidated below by means of FIG. 1:

An electrical contact element 1 preferably has two contact areas $2_1$ and $2_2$. Each of these two contact areas $2_1$ and $2_2$ has in each case a contact surface $3_1$ or $3_2$, which in each case serves for electrical contacting with a contact surface of an associated electrical or electronic component to be contacted. Thus, an electrical connection is made between the contact surfaces of the two electrical or electronic components to be contacted via an electrical contact element. Both the electrical or electronic components as well as the associated contact surfaces are not depicted in FIG. 1 and in all of the subsequent figures.

In addition, the electrical contact element 1 can also have more than two contact areas and associated contact surfaces, which is covered by the invention. In this way, more than two contact surfaces can be electrically connected to each other via the same contact element. Alternatively, in this way, a contact surface can be contacted in parallel by a plurality of contact areas of the electrical contact element.

The mechanical and electrical connection of the two contact areas $2_1$ and $2_2$ is made through a connecting area 4. Since the distance between the two electrical or electronic components is subjected in general to a certain fluctuation, the connecting area 4 preferably has a certain elasticity. In this way, a secure electrical connection between the two electrical or electronic components via the electrical contact element 1 is ensured.

The elasticity of the connecting area 4, as is shown in FIG. 1, is realized by two spring arms $4_1$ and $4_2$. Each spring arm $4_1$ and $4_2$ in each case has a contact area $2_1$ or $2_2$ on its one end or is connected at its one end in each case with a contact area $2_1$ or $2_2$. The two spring arms $4_1$ and $4_2$ are in each case connected with each other at their other end.

Alternatively, the connecting area 4 can also be realized as a single spring arm (English: cantilever), as an elastic buckling rod (English: buckling beam).

In addition to these elastic contact elements having an elasticity non-elastic contact elements also fall within the scope of the present disclosure of the invention. In the case of such non-elastic contact elements the individual contact areas are in each case connected with one another via a rigid connecting area. In order to compensate for a variable distance between the contact surfaces of the two electrical or electronic components to be contacted, the elasticity is achieved by means of an additional elastic component, which is connected with the rigid contact element. The elastic component can be, for example, a spring acting on the contact element or a component made from elastomer acting on the contact element.

In addition to the embodiment of the electrical contact element 1 depicted in FIG. 1 all of the technically reasonable geometrical shapes of an elastic or non-elastic contact element with in each case a plurality of contact areas also fall within the scope of the present disclosure of the invention. The geometrical shape used depends very much on the mechanical and electrical requirements of the respective technical application of the electrical contact element. The range in this connection extends from electrical contacts for direct current or low frequency applications to highly complex electrical contacts for high frequency applications, including coaxial plugs.

The order of magnitude of an elastic or non-elastic contact element can also extend from comparatively large dimensions, for example, for high-current or high voltage applications to micromechanical extensions for contact elements for the contacting of highly integrated semiconductor components. The manufacturing technologies applicable to the production of the respective electrical contact elements are accordingly different. These range from machining and casting techniques for voluminous contact elements to fabrication technologies, for example, in LIGA technology, for micromechanical contact elements.

All of the mentioned contact elements also fall within the scope of the present disclosure of the invention, are preferably produced from a base body made, for example, from a metallic or ceramic base material, which is designated below as the first material, and a coating applied to the base body made from a coating material. A material with a higher material hardness compared to the coating material, for example, copper beryllium or spring steel is used as the first material, in order to achieve a certain mechanical minimum stability of the contact element. A comparatively softer material is used as the coating material, which has good electrical conductivity and at the same time a high corrosion resistance. For this purpose, preferably gold, but also silver, ruthenium or rhodium is used. In order to realize a low electrical contact resistance along the entire contact element, a high corrosion resistance over the entire surface of the electrical contact element and an as simple realization as possible of the coating, preferably the entire base body of the electrical contact element is provided with a coating. Alternatively, the coating can also be limited solely to individual areas of the electrical contact element, preferably to the individual contact areas of the electrical contact element.

Based on this basic structure of an electrical contact element 1 in at least one area within at least one contact area the first material of the base body is at least partially replaced by a second material with a higher electrical conductivity compared to the first material. The second material, as was already mentioned, in a first manifestation of the present disclosure corresponds to the coating material and in a second manifestation of the present disclosure is a different material than the coating material.

If the removal of the coating on the contact surface $3_1$ or $3_2$ occurs in at least one contact area $2_1$ and $2_2$ as a result of a plurality of plug cycles, in each case a new contact surface is formed in the respective contact area $2_1$ and $2_2$ This new contact surface not only has coating material in each case as in the case of an electrical contact element according to the prior art on its edges, which coating material belongs to the coating of the outer surfaces of the electrical contact element adjacent to the new contact surface. Rather, in the new contact surface of the at least one area of the base body it penetrates to the outer surface of the electrical contact element, in which the first material is at least partially replaced by the second material. In this way in the case of an electrical contact element in accordance with the present disclosure the new contact surface the surface areas increase with in each case a higher electrical conductivity relative to the first material, that is, the base material of the base body, compared to an electrical contact element according to the prior art. Thus, despite a removal of the coating the electrical contact resistance of the electrical contact element in accordance with the present disclosure is advantageously improved in the respective contact area over the prior art.

In a first embodiment of the contact element the areas, in which the first material of the base body is at least partially replaced by the second material, in each case is realized by a through-bore or a blind-hole bore.

Figure 2A:
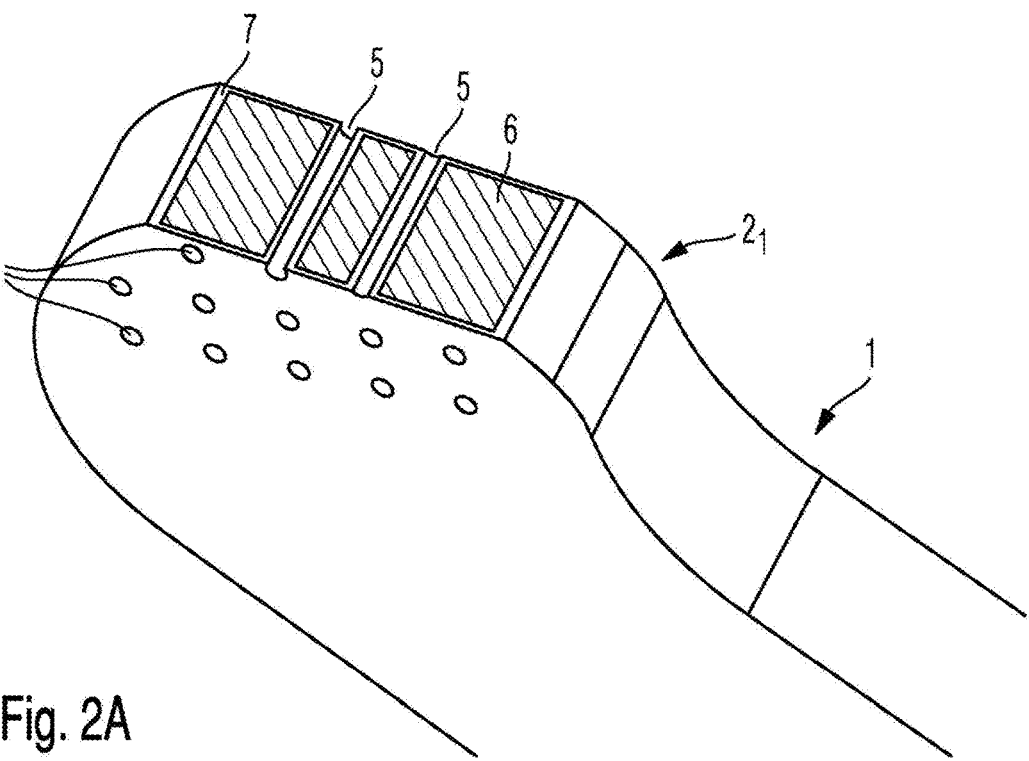
FIG. 2A shows a representation of a first manifestation of a first sub-variant of a first embodiment of an electrical contact element in accordance with the present disclosure with a partial cross-section representation.

A plurality of through-bores emerge from FIG. 2A, which extend in one contact area $2_1$ from an outer surface of the electrical contact element 1 through the base body 6 (shown hatched) of the electrical contact element 1 to the opposite outer surface of the electrical contact element 1 and thereby penetrate the coating 7 (shown not hatched) in the respective outer surface area.

Preferably, in the respective contact area $2_1$ or $2_2$ in each case a plurality of through-bores 5 is provided. The arrangement and the distances of the individual through-bores 5 are selected such that in the respective contact area $2_1$ or $2_2$, on the one hand, sufficient first material for the mechanical stabilization of the electrical contact element 1 and, on the other hand, as much of the second material exists for the improvement of the electrical contact resistance on the new contact surfaces in the event of removal.

Alternatively, however, the realization of a single through-bore 5 through the base body 6, which is arranged preferably centrally to the respective contact surface $3_1$ or $3_2$, is also possible and falls within the scope of the present disclosure of the invention.

In the first sub-variant of a first embodiment of the electrical contact element 1 depicted in FIG. 2A the first material of the base body 6 is replaced in the individual through-bores 5 in each case only partially by a second material, while the inner wall of the individual through-bore 5 is in each case coated with the second material. If coating material is used as the second material, in this case the insertion of coating material into the individual through-bores 5 can be realized solely by a coating process. This constitutes the simplest realization variant in production terms.

In the case of the subvariant of a first embodiment of the electrical contact element 1 depicted in FIG. 2A, in which the first material of the base body 6 is replaced in the individual through-bores 5 in each case only partially by a second material, the areas of the coating 7 on the two outer surfaces of the electrical contact element 1, which connect to the areas of the through-bore 5 freed of the second material, are also not filled with the coating material.

Figure 2B:
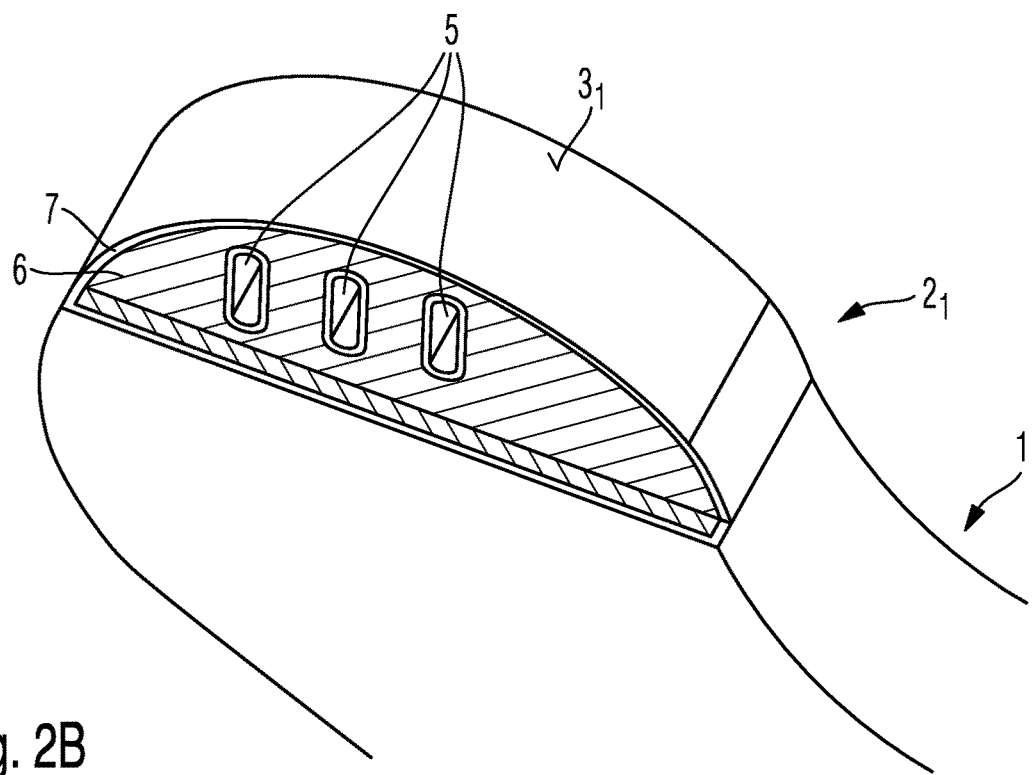
FIG. 2B shows a representation of a second manifestation of a first sub-variant of a first embodiment of an electrical contact element in accordance with the present disclosure with a partial cross-section representation.
Figure 2C:
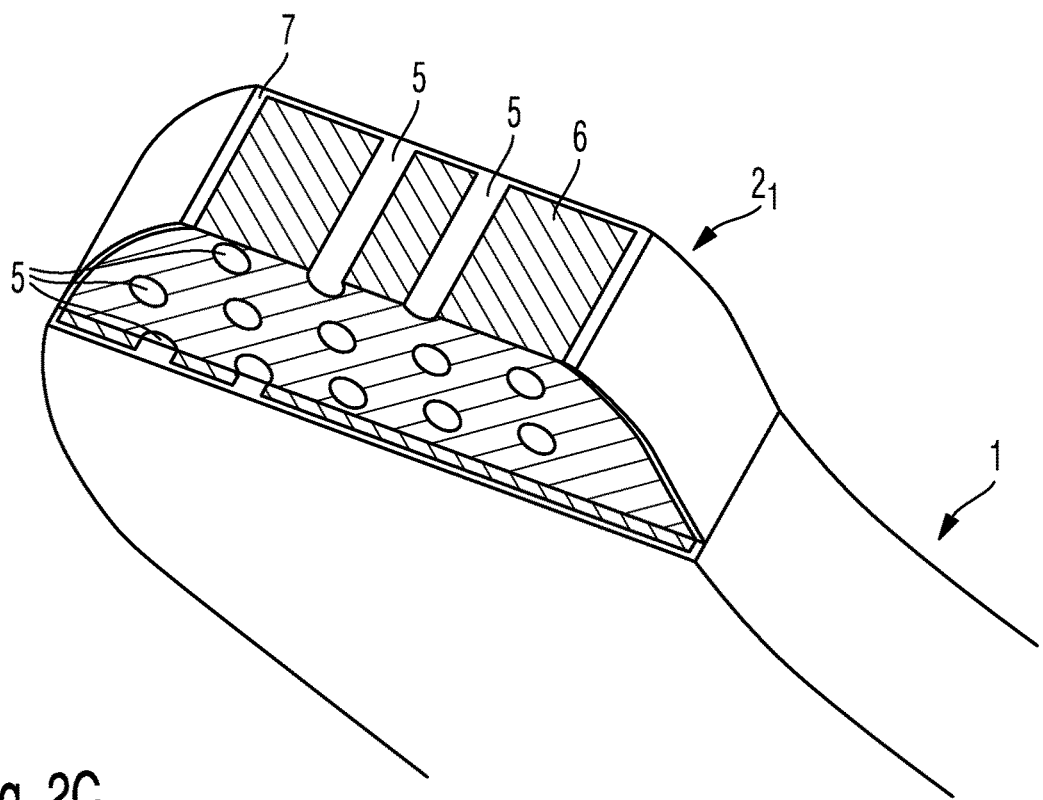
FIG. 2C shows a representation of a first manifestation of a second sub-variant of a first embodiment of an electrical contact element in accordance with the present disclosure with a partial cross-section representation.

In order to achieve a lower electrical contact resistance on the new contact surfaces after a removal of the original contact surfaces $3_1$ or $3_2$, the individual through-bores 5 are in each case completely filled with a second material in a second sub-variant of the first embodiment of the electrical contact element according to FIG. 2C. A realization of such a contact element 5 is significantly more expensive. If a micromechanical contact element must be produced, then a fabrication technology is provided for this purpose, for example, the lithography-electroplating-molding (LIGA) technology.

Preferably, in both sub-variants the individual through-bores 5 are arranged in a specific arrangement, that is, in a specific grid, relative to one another. In this connection, the individual through-bores 5 are preferably arranged in each case offset relative to each other between the individual planes, which run parallel to the contact surface $3_1$ and $3_2$ in the respective contact area $2_1$ or $2_2$. Thus, it is ensured that over the entire service life of the electrical contact element 1, that is, in each phase of the abrasion of the contact area, the in each case newly created contact surface in the respective contact area always contains approximately the same ratio between the summed contact surface areas made from the first material and summed contact surface areas made from the second material and from the coating material. Thus, the electrical contact resistance remains in each case approximately constant over all contact surfaces within a contact area newly created in each case by a removal.

Since the ratio between the summed contact surface areas with the second material and the summed contact surface areas with the first material on the newly created contact areas in the case of the second sub-variant is higher than in the case of the first sub-variant, the distances between the individual through-bores 5 for achieving an equally high electrical contact resistance in the second sub-variant can be selected larger than in the case of the first sub-variant. Thus, in the second sub-variant correspondingly fewer through-bores 5 must be provided than in the case of the first sub-variant.

However, in addition to a regular arrangement of the individual through-bores 5 within the respective contact area $2_1$ or $2_2$ a non-regular, that is, a stochastic arrangement of the individual through-bores 2 is also possible and falls within the scope of the present disclosure of the invention. The stochastic arrangement of the individual through-bores 5 also guarantees an approximately constant ratio between the summed contact surface areas made from the first material and the summed contact surface areas made from the second material or the coating material in each contact surface of a contact area newly created by removal. Thus, also an approximately constant electrical contact resistance of the contact surface of a contact area is also achieved over the entire service life of the electrical contact element.

Also, the individual through-bores 5, as is shown in the figures, do not necessarily have to be arranged parallel to each other, but rather can also be arranged to a certain degree in a specific angular orientation to each other.

Figure 2D:
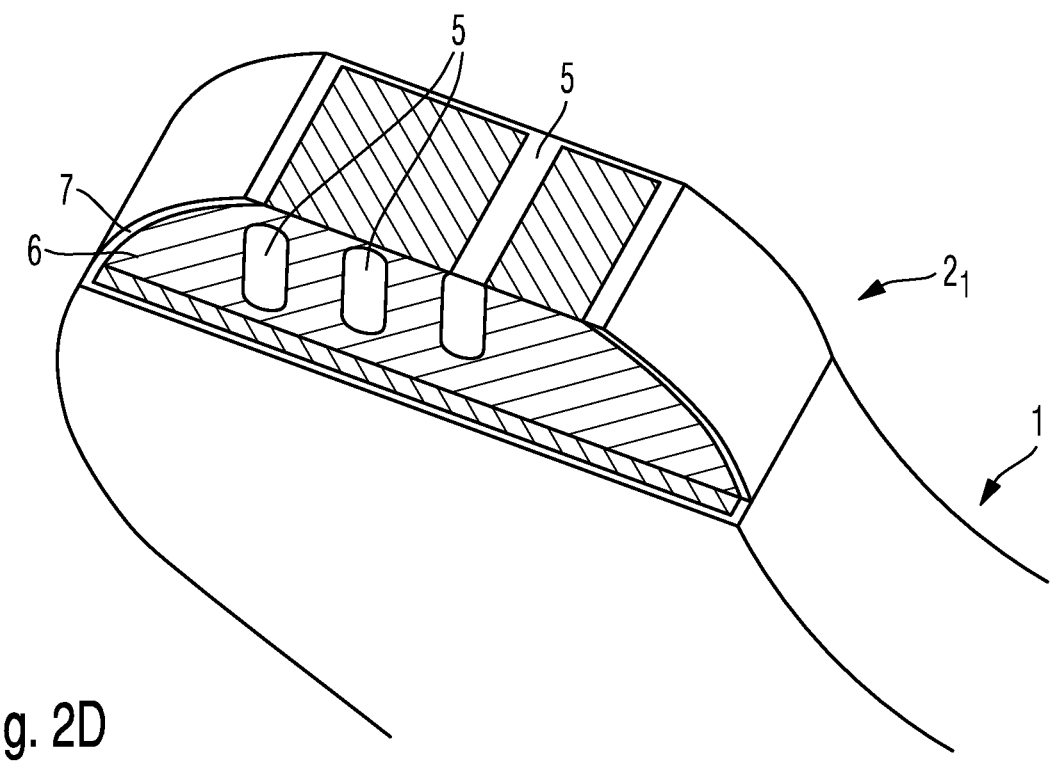
FIG. 2D shows a representation of a second manifestation of a second sub-variant of a first embodiment of an electrical contact element in accordance with the present disclosure with a partial cross-section representation.

In addition to through-bores 5 with a circular cross-section profile according to FIGS. 2A and 2C, through-bores 5 with an elongated hole cross-section profile are possible, as they are depicted in FIG. 2B for the first sub-variant of the first embodiment of the electrical contact element 1 and in FIG. 2D for the second sub-variant of the first embodiment. If the individual through-bores 5 with elongated hole profile arranged in parallel are arranged offset relative to each other in the direction of the longer profile extension, as is indicated in FIGS. 2B and 2D, then in the case of the in each case newly created contact surface a constant ratio advantageously results over the entire service life of the electrical contact element between the summed contact surface areas made from the first material and the summed contact surface areas made from the second material and from the coating material. The electrical contact resistance of the in each case newly created contact surface of a contact area thus remains constant over the service life of the electrical contact element.

In addition to the through-bores 5 with circular cross-section profile or elongated hole cross-section profile other cross-section profiles, for example, square, rectangular, elliptical or other cross-section profiles are also possible and fall within the scope of the present disclosure of the invention.

Figure 2E:
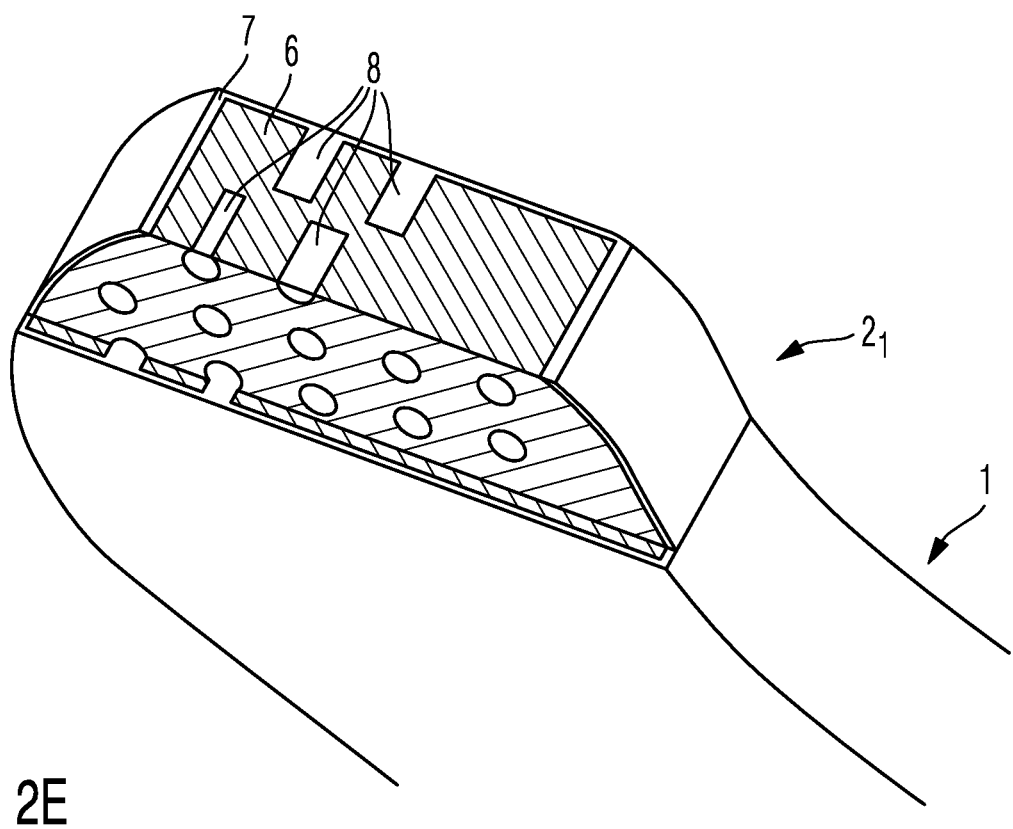
FIG. 2E shows a representation of a further second manifestation of a second sub-variant of a first embodiment of an electrical contact element in accordance with the present disclosure with a partial cross-section representation.

In addition to the preferred use of through-bores 5, blind-hole bores 8 are also possible and fall within the scope of the present disclosure of the invention. According to FIG. 2E, blind-hole bores in this connection run in the base body 6 within a contact area $2_1$ or $2_2$ from an outer surface of the base body 6, which runs perpendicular to an outer surface of the electrical contact element 1 adjacent to the respective contact surface $3_1$ or $3_2$, into the interior of the base body and end in the interior of the base body. In order to achieve as uniform as possible a distribution of the summed contact surface areas made from the first material and of the summed contact surface areas made from the second material and the coating material on the in each case newly created contact surfaces in the event of the removal of the electrical contact element 1, as depicted in FIG. 2E, the blind-hole bores must be introduced in each plane parallel to the respective contact surface $3_1$ or $3_2$ in each case in the move from one of the two opposite outer surfaces of the electrical contact element 1 into the base body 6.

If a blind-hole bore 8 is present, which equivalent to the through-bore 5 of FIGS. 2A and 2B is only partially filled with a second material, then the area of the coating 7 on the outer surface of the electrical contact element 1, which is connected to the area of the blind-hole bore 8 freed from the second material, is also not filled with the coating material.

Figure 2F:
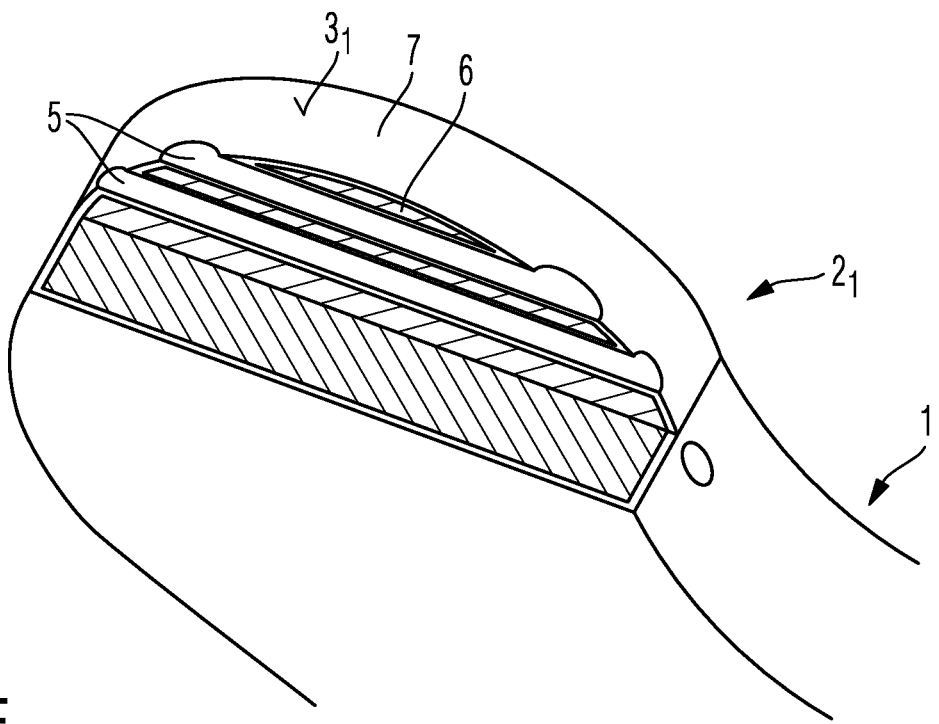
FIG. 2F shows a representation of a third manifestation of a first sub-variant of a first embodiment of an electrical contact in accordance with the present disclosure with a partial cross-section representation.
Figure 2G:
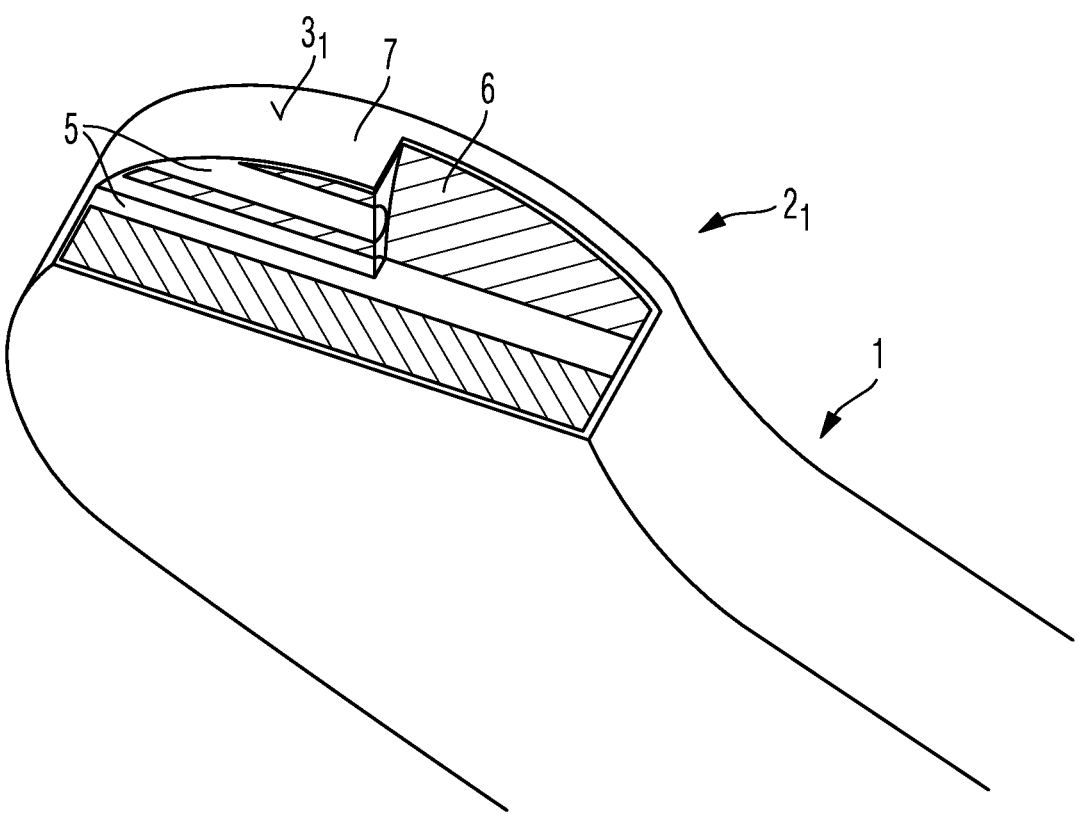
FIG. 2G shows a representation of a third manifestation of a second sub-variant of a first embodiment of an electrical contact element in accordance with the present disclosure with a partial cross-section representation.

In each case through-bores 5 in the base body 6 within the contact area $2_1$ emerge from FIGS. 2F and 2G, which run approximately parallel to the associated contact surface $3_1$. These through-bores 5 extend relative to the through-bores 5 depicted in FIGS. 2A to 2D between the two other, also opposite outer surfaces of the base body 6, which in each case are oriented perpendicular to the contact surface $3_1$.

Due to the significantly smaller width of these two opposite outer surfaces of the electrical contact element 1 in relation to the width of the two other outer surfaces, through which the through-bores 5 run according to FIGS. 2A to 2D, in this connection the number of through-bores 5 in each plane parallel to the contact surface $3_1$ is significantly reduced and is preferably limited to one through-bore 5 per plane.

Through-bores 5 are depicted in FIG. 2F, in which in each case only the inner wall is coated with the second material, while through-bores 5 emerge from FIG. 2G, in which the first material of the base body 6 is completely replaced by the second material.

Figure 2H:
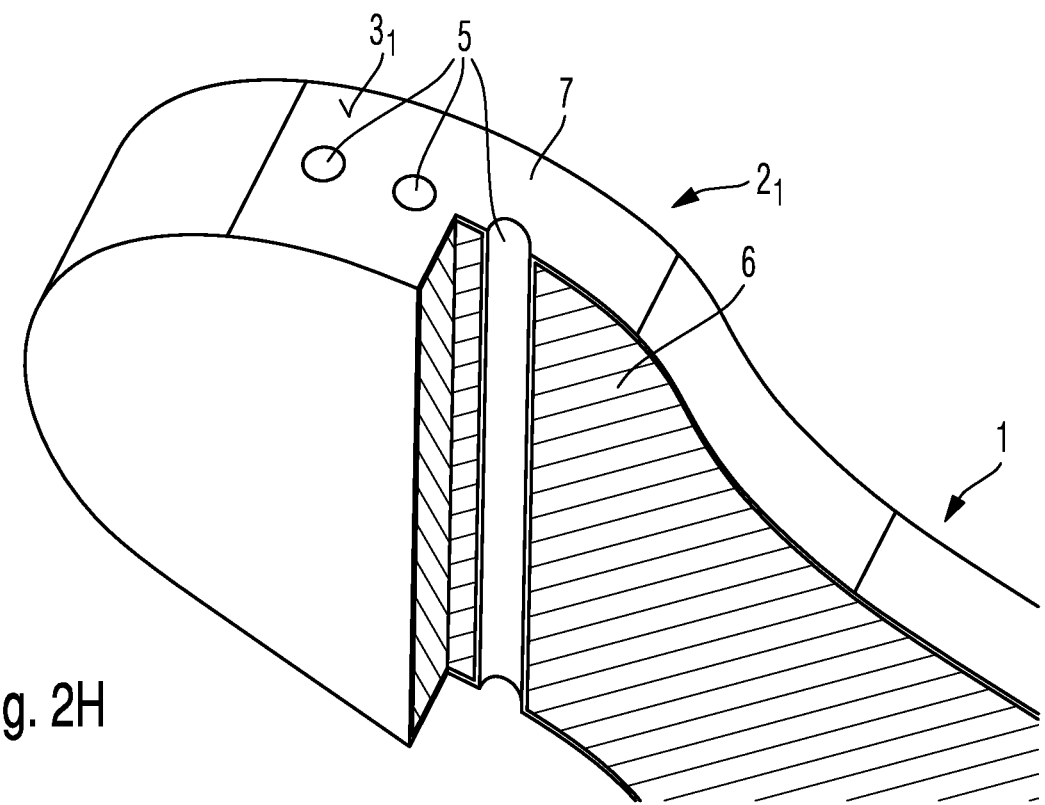
FIG. 2H shows a representation of a fourth manifestation of a first sub-variant of a first embodiment of an electrical contact element in accordance with the present disclosure with a partial cross-section representation.
Figure 2I:
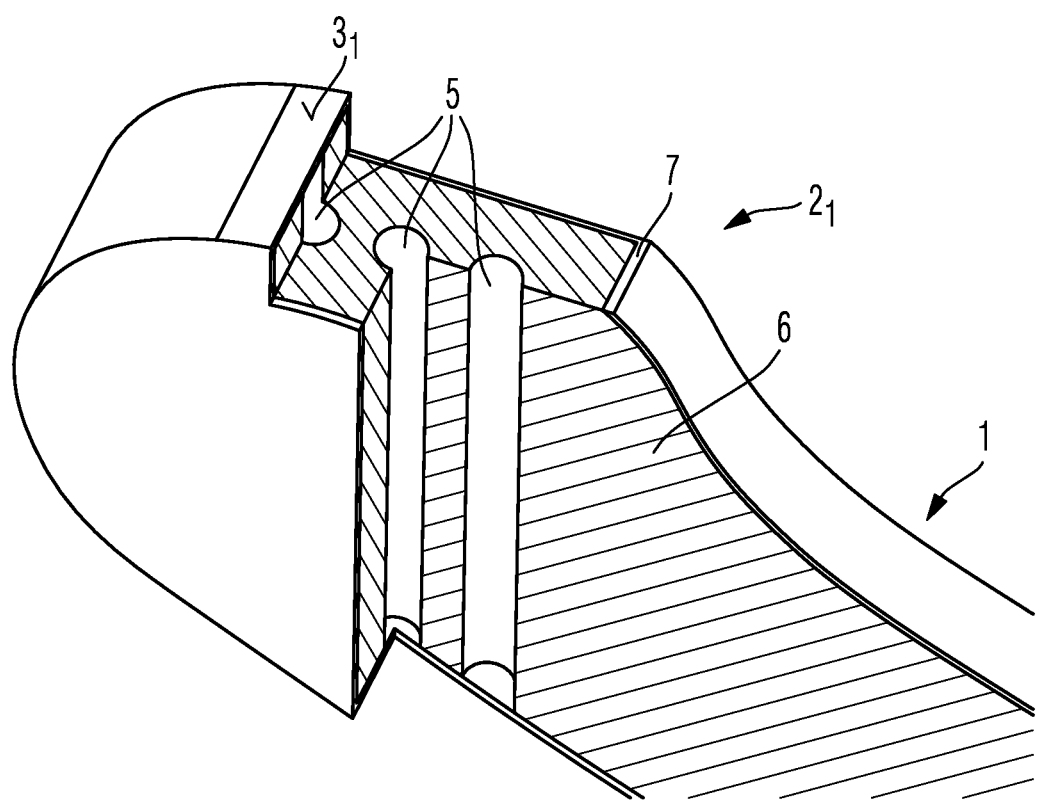
FIG. 2I shows a representation of a fourth manifestation of a second sub-variant of a first embodiment of an electrical contact element in accordance with the present disclosure with a partial cross-section representation.

Finally, through-bores 5 can be seen from FIGS. 2H and 2I, which run perpendicular to the contact surface $3_1$ of the contact area $2_1$ from in each case an outer surface of the base body 6 parallel to the contact surface $3_1$ of the electrical contact element 1 to an in each case opposite outer surface of the base body 6.

In FIG. 2H, through-bores 5 are depicted of a first sub-variant of the first embodiment of the electrical contact element 1, in which only the inner wall of the individual through-bore 5 is in each case coated with the second material. Equivalent to the through-bores 5 of FIGS. 2A and 2B, which are only partially filled with a second material, in the case of the through-bores 5 of FIG. 2H the areas of the coating 7 on the two outer surfaces of the electrical contact element 1, which in each case are connected to the area of the respective through-bore 5 freed from the second material, are also not filled with the coating material.

On the other hand, from FIG. 2I through-bores 5 of a second sub-variant of the first embodiment of the electrical contact element 1 emerge, in which the first material of the base body 6 is completely replaced by the second material.

The technical advantage of a manifestation of the through-bores according to FIGS. 2H and 2I is that due to the continuous course of the individual through-bores 5 in the contact area $2_1$ the ratio between the summed contact surface areas made from the first material and the summed contact surface areas made from the second material and from the coating material in the case of the newly created contact surfaces during the entire service life of the electrical contact element 1 and thus the electrical contact resistance in the contact area $2_1$ always remains constant. The arrangement and the number of the individual through-bores 5 in the contact area $2_1$ must be selected such that, on the one hand, a sufficient electrical contact resistance is ensured during the entire service life of the electrical element 1 and, on the other hand, a sufficient mechanical stability of the electrical contact element 1 in the contact area $2_1$.

Figure 2J:
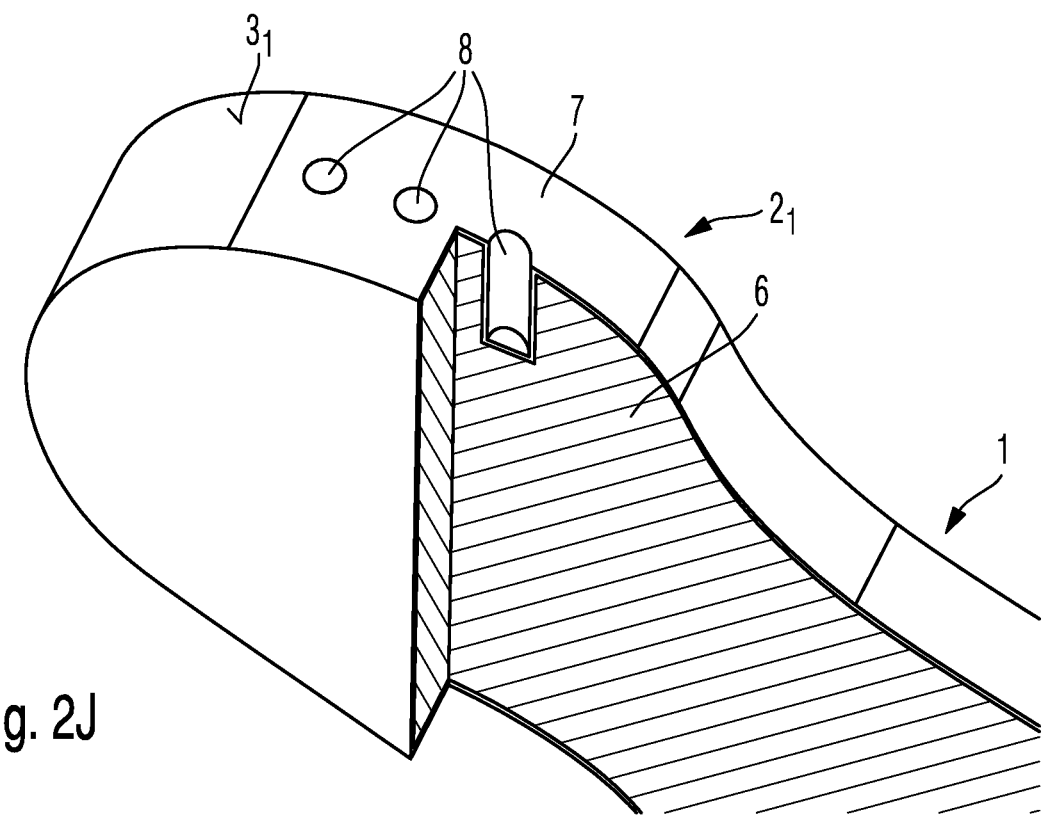
FIG. 2J shows a representation of a fifth manifestation of a first sub-variant of a first embodiment of an electrical contact element in accordance with the present disclosure with a partial cross-section representation.

In FIG. 2J, blind-hole bores 8 are depicted, which in each case extend from an outer surface of the base body 6, which runs parallel to the contact surface $3_1$ of the contact area $2_1$, into the base body 6 and end at a specific depth in the base body 6. The areas of the coating 7 on the outer surfaces of the electrical contact element 1, which in each case are connected to the areas of the individual blind-hole bores 8 freed of the second material, are not filled with the coating material.

The depth of the individual blind-hole bores 8 must be dimensioned such that despite a removal over the entire service life of the electrical contact element 1 the in each case newly created contact surface still contains surface areas with the second material present in each case in the individual blind-hole bores 8.

In a second embodiment of the contact element 1 in each contact area starting from the associated contact surface in each case at least one slot 9 is provided, which in each case extends into the base body 6. Preferably, a plurality of parallel slots 9 is provided with a specific slot width, a specific slot depth and a specific longitudinal extension from an outer surface of the contact element, which is adjacent to the contact surface $3_1$ or $3_2$ of the respective contact areas $2_1$ and $2_2$, to the opposite outer surface.

Figure 3A:
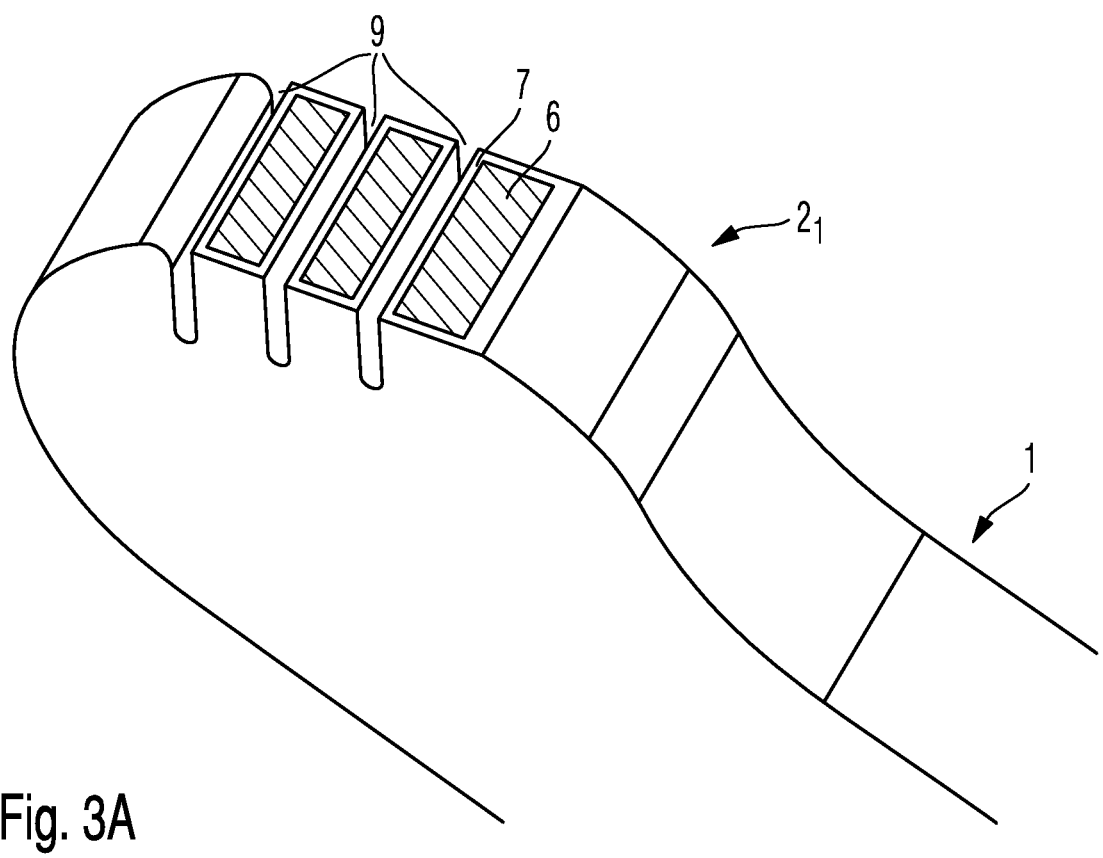
FIG. 3A shows a representation of a first sub-variant of a second embodiment of an electrical contact element in accordance with the present disclosure with a partial cross-section representation.

In a first sub-variant of the second embodiment according to FIG. 3A the individual slot is only partially filled with the second material. In particular, the inner wall of the individual slot 9 is coated with the second material. In a second sub-variant of the second embodiment according to FIG. 3B the individual slot 9 is completely filled with the second material.

The slot depth of the individual slot 9 must in turn be dimensioned such that over the entire service life of the electrical contact element 1 the contact surfaces in each case newly created by removal in each case always contain contact surface areas made from the second material.

The slot width of the individual slot 9, the number of the parallel slots 9 and in the case of the first sub-variant of the second embodiment the coating thickness of the second material within the individual slots 9 must in this connection be dimensioned such that in the case of a removal of the contact element 1 the in each case newly created contact surfaces in each case have a ratio of the summed contact surface areas made from the first material to the summed contact surface areas made from the second material and from the coating material, which ensures a sufficiently small electrical contact resistance in the respective contact area.

Figure 3B:
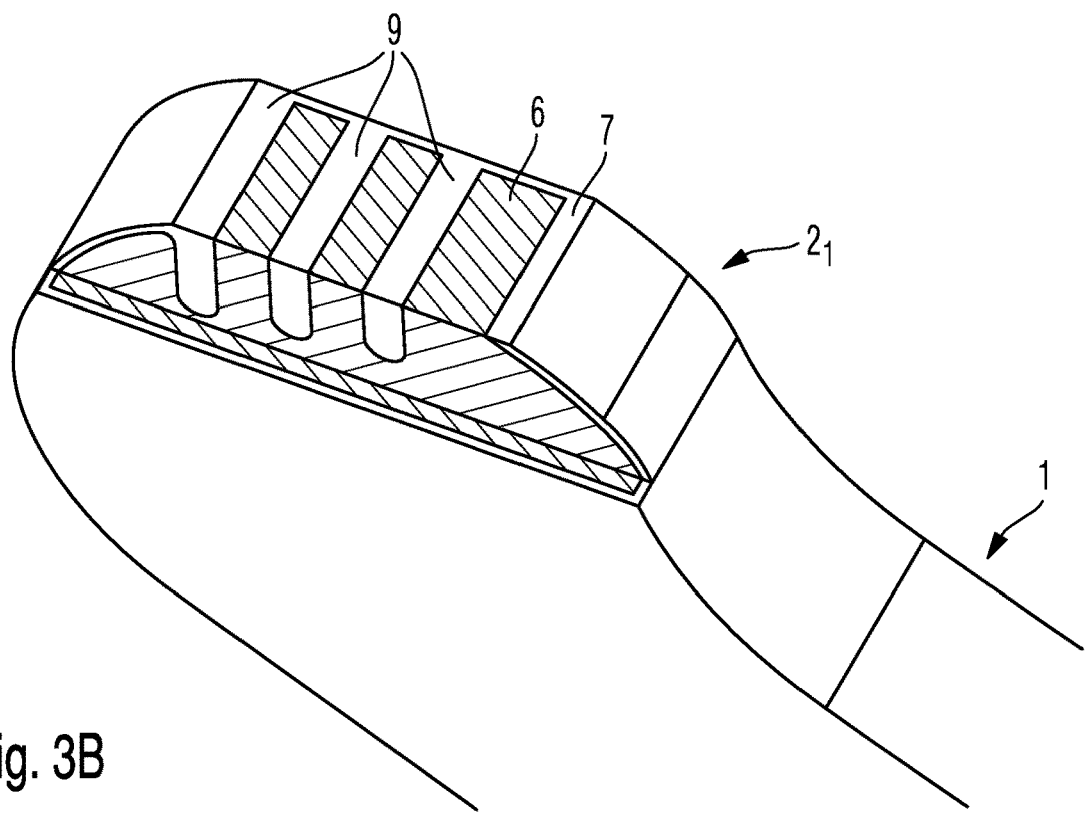
FIG. 3B shows a representation of a second sub-variant of a second embodiment of an electrical contact element in accordance with the present disclosure with a partial cross-section representation.

The at least one slot 9 can in each case have a longitudinal orientation, which, as is depicted in FIGS. 3A and 3B, runs between the two opposite outer surfaces of the electrical contact element 1, which are adjacent to the contact surface $2_1$ and in each case have the smaller distance to each other. Alternatively, the at least one slot 9 equivalent to the course of the through-bores 5 in FIGS. 2F and 2G can also run between the two opposite outer surfaces of the contact element 1, which are adjacent to the contact surface $2_1$ and in each case have a larger distance to each other.

Figure 4:
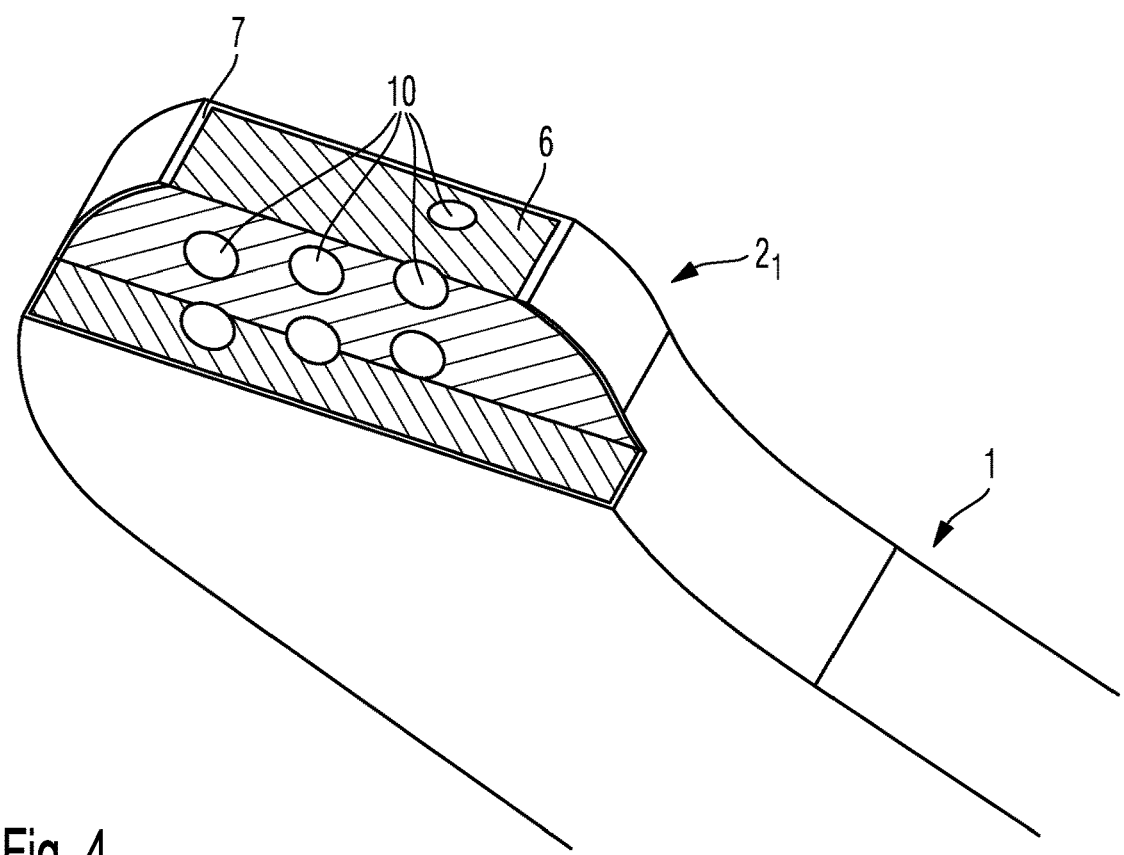
FIG. 4 shows a representation of a third embodiment of an electrical contact element in accordance with the present disclosure with a partial cross-section representation.

In a third embodiment of the electrical contact element 1 according to FIG. 4, the at least one area between the respective contact area $2_1$ or $2_2$, in which in each case the first material of the base body 6 is replaced by the second material, is in each case a cavity 10 located only within the base body 6, which is filled with the second material. Preferably, within the respective contact area $2_1$ or $2_2$ in each case a plurality of cavities 10 is provided, which is present either in a regular arrangement, for example, in a specific grid, or in a non-regular arrangement, that is, stochastically distributed.

The individual cavities 10 can in each case have a regular geometrical shape, for example, a sphere, cube, cuboid, ellipsoid, etc., or any other non-regular geometrical shape. The size of the individual cavities 10, for example, the diameter of a spherical cavity, is preferably the same or is in the same order of magnitude. Alternatively, the individual cavities 10 can also have a different size and in each case assume a different geometrical shape.

In general, the number, the arrangement, the geometrical shape and the size of the individual cavities 10 must be selected such that over the entire service life of the electrical contact element 1 the contact areas of surface of the respective contact area newly created by a removal in each case have a ratio of the summed contact surface area made from the first material to the summed contact surface areas made from the second material and from the coating material, which ensures approximately a constant electrical contact resistance in the respective contact area.

In a fourth embodiment of the electrical contact element 1 the at least one area in the base body 6 within the respective contact area $2_1$ and $2_2$, in which the first material is replaced by a second material with higher electrical conductivity compared to the first material, is in each case a layer 11, which in each case runs perpendicular to the contact surface $3_1$ or $3_2$ of the respective contact area $2_1$ and $2_2$. Preferably, a plurality of layers 11 running in parallel are provided within the electrical contact 1. Alternatively, however, as is depicted in FIG. 5A, a single layer 11 within the electrical contact element 1 is also possible and falls within the scope of the present disclosure of the invention.

The at least one layer 11 can extend only within the respective contact area $2_1$ or $2_2$ of the electrical contact element 1. Preferably, the at least one layer 11 extends over the entire electrical contact element 1, as is depicted in FIG. 5B. In this connection, to illustrate the course of the layer 11 in a simplified manner the coating 7 on the narrow peripheral end face is not depicted. The base body 6 of the electrical contact element 1, as is depicted in FIG. 5B, results from a plurality of layers $6_1$ and $6_2$ made from the first material, which in each case run parallel to the at least one layer 11 made from the second material.

If a micromechanical contact element is present, then the individual layers made from the first material or from the second material can be produced by means of suitable fabrication technology, for example, by alternating galvanic deposition of the first and of the second material. If an electrical contact element 1 with a greater extent is present, then the individual layers must be produced either with conventional machining or casting technology and then connected with each other with a suitable connection technology, for example, by means of snap connection, pinning, soldering, adhesion, screws.

Figure 5A:
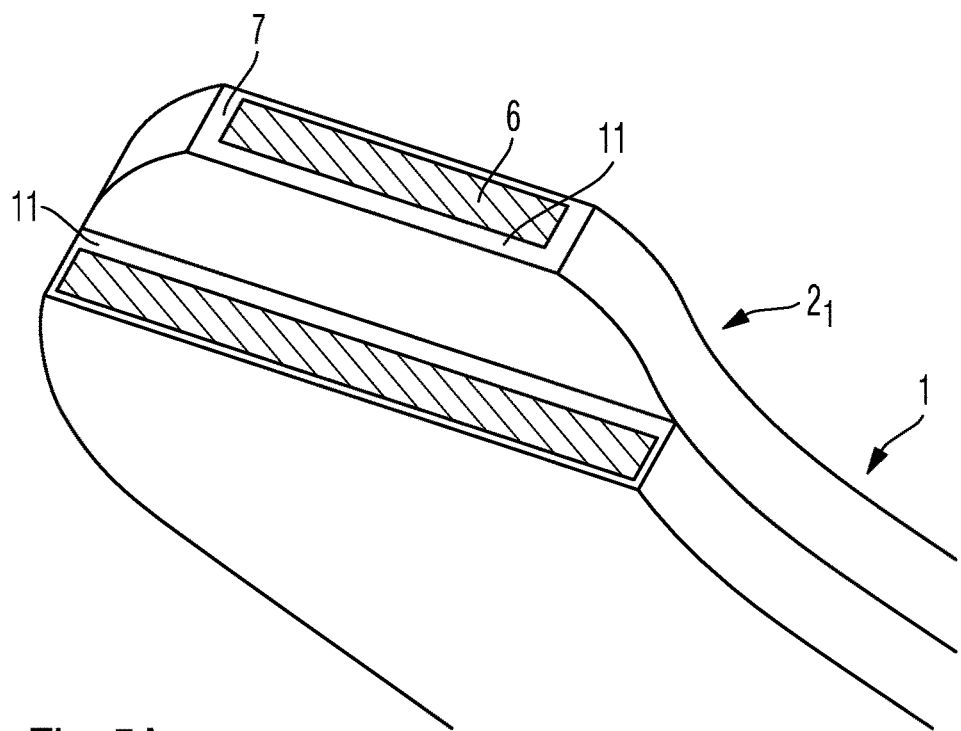
FIG. 5A shows a representation of a fourth embodiment of an electrical contact element in accordance with the present disclosure with a partial cross-section representation and FIG. 5B shows a representation of a fourth embodiment of an electrical contact element in accordance with the present disclosure without a coating on the face side.
Figure 5B:
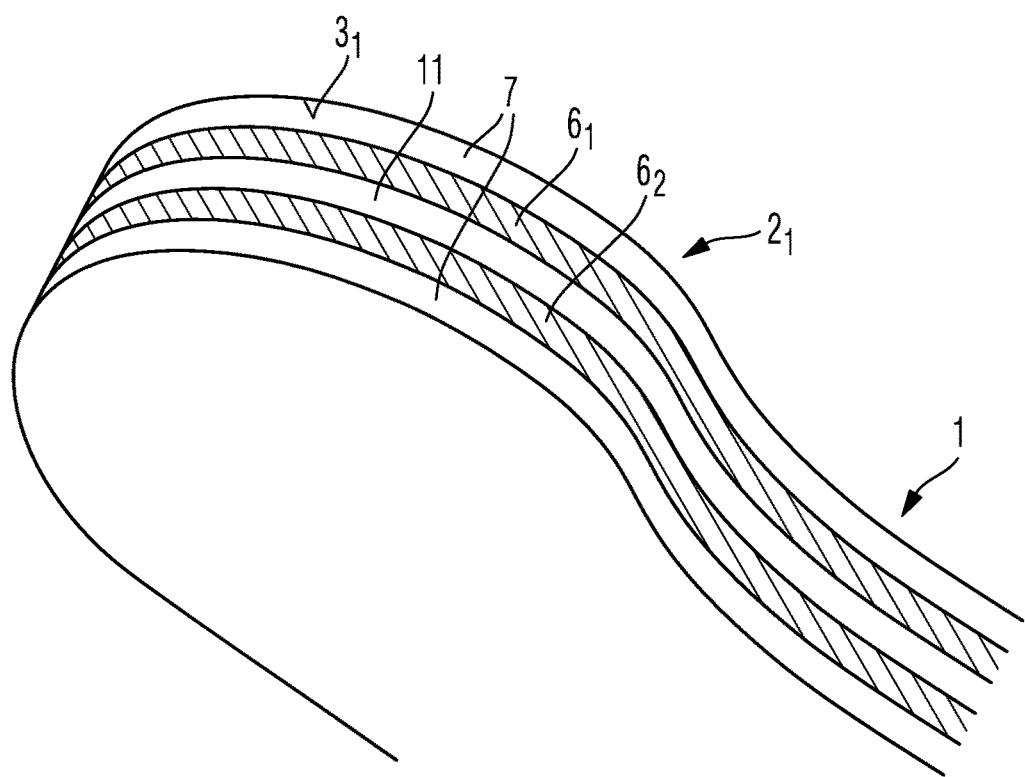

In a further manifestation of the fourth embodiment of the electrical contact element 1 the individual parallel layers 11 made from the second material and the layers $6_1$, $6_2$ ... arranged therebetween made from the first material must also be arranged in an orientation, on the one hand, perpendicular to the respective contact surface $3_1$ and $3_2$ of the respective contact area $2_1$ or $2_2$ and, on the other hand, perpendicular to the orientation of the layer 11 made from the second material and the layers $6_1$ and $6_2$ made from the first material according to FIGS. 5A and 5B. In this case, the layer sequence of the layers made from the second material and of the layers $6_1$ and $6_2$ made from the first material is limited solely to the respective contact area $2_1$ or $2_2$ of the contact element 1.

The thickness of the individual layers 11 made from the second material in relation to the thickness of the individual layers $6_1$, $6_2$, . . . made from the first material must be selected such that in the respective contact area $2_1$ or $2_2$ in each case a sufficiently small electrical contact resistance is present. Preferably, the thickness of the individual layers 11 made from the second material must be designed to be the same for production reasons. Alternatively, however, different thicknesses of the individual layers 11 made from the second material are also possible and fall within the scope of the present disclosure of the invention. In particular, the thickness of the layers 11 made from the second material in the vicinity of the coating 7 of the electrical contact element 1 must be designed to be greater than the thickness of the layers 11 made from the second material in the center of the electrical contact element 1.

Although the present invention was fully described above by means of preferred embodiments, it is not limited thereto, but rather can be modified in a variety of ways.

LIST OF REFERENCE SYMBOLS 1 contact element
$2_1$, $2_2$ contact areas
$3_1$, $3_2$ contact surface
4 connecting area
$4_1$, $4_2$ spring arms
5 through-bore
6 base body
$6_1$, $6_2$ layers of the base body
7 coating
8 blind-hole bore
9 slot
10 cavity
11 layer

The invention claimed is:

1. An electrical contact element, comprising:
a main body of a first material; and
a plating, wherein
said main body comprises at least one hollow,
said plating contacts an outer surface of said main body,
said plating contacts an entire inner surface of said at least one hollow,
said first material is harder than said plating, and
said plating has a higher electrical conductivity than said first material.

2. The electrical contact element of claim 1, wherein:
said main body comprises a contact region, and
said at least one hollow is located in said contact region.

3. The electrical contact element of claim 2, wherein:
said main body has an elongated shape, and
said contact region is located at an end region of said main body.

4. The electrical contact element of claim 1, wherein:
said at least one hollow comprises a bore that extends through said main body.

5. The electrical contact element of claim 1, wherein:
said at least one hollow comprises a blind hole that extends partially into said main body.

6. The electrical contact element of claim 1, wherein:
said at least one hollow comprises a slit.

7. The electrical contact element of claim 1, wherein:
said at least one hollow comprises at least three hollows.

8. The electrical contact element of claim 1, wherein:
said plating fills said at least one hollow.

9. The electrical contact element of claim 1, wherein:
said plating encases an entirety of said main body.

10. An electrical contact element, comprising:
a main body of a first material; and
a plating, wherein
said main body comprises at least one hollow,
said plating contacts an outer surface of said main body,
said at least one hollow is filled with a second material,
said first material is harder than said plating,
said first material is harder than said second material,
said plating has a higher electrical conductivity than said first material, and
said second material has a higher electrical conductivity than said first material.

11. The electrical contact element of claim 10, wherein:
said main body comprises a contact region, and
said at least one hollow is located in said contact region.

12. The electrical contact element of claim 11, wherein:
said main body has an elongated shape, and
said contact region is located at an end region of said main body.

13. The electrical contact element of claim 10, wherein:
said at least one hollow comprises a bore that extends through said main body.

14. The electrical contact element of claim 10, wherein:
said at least one hollow comprises a blind hole that extends partially into said main body.

15. The electrical contact element of claim 10, wherein:
said at least one hollow comprises a slit.

16. The electrical contact element of claim 10, wherein:
said at least one hollow comprises at least three hollows.

17. The electrical contact element of claim 10, wherein:
said plating encases an entirety of said main body.

18. An electrical contact element, comprising:
a first layer of a first material;
a second layer of a second material;
a third layer of said third material; and
a fourth layer of said fourth material, wherein
said second layer is sandwiched between said first layer and said third layer,
said third layer is sandwiched between said second layer and said fourth layer,
said first material is harder than said second material and said fourth material,
said third material is harder than said second material and said fourth material,
said fourth material has a higher electrical conductivity than said first material and said third material, and
said second material has a higher electrical conductivity than said first material and said third material.

19. The electrical contact element of claim 18, wherein:
said electrical contact element has an elongate shape.

20. The electrical contact element of claim 18, wherein:
said third material is said first material, and
said fourth material is substantially identical to said second material.

\* \* \* \* \*